March 2, 1965 R. F. RUTZ 3,171,762
METHOD OF FORMING AN EXTREMELY SMALL JUNCTION
Filed June 18, 1962 2 Sheets-Sheet 1

INVENTOR.
RICHARD F. RUTZ
BY John F. Ohlandt Jr.
ATTORNEY

United States Patent Office 3,171,762

Patented Mar. 2, 1965

3,171,762

METHOD OF FORMING AN EXTREMELY SMALL JUNCTION

Richard F. Rutz, Cold Spring, N.Y., assignor to International Business Machines Corporation, New York, N.Y., a corporation of New York Filed June 18, 1962, Ser. No. 203,211

13 Claims. (Cl. 148—175)

This invention relates to semiconductor devices and, in particular, to an improved method of fabricating and packaging particular types of semiconductor devices, especially those known as tunnel diodes.

In the fabrication of tunnel diode devices it has been found important to be able to create a junction of extremely small area so as to allow for the possibility of obtaining extremely small peak currents in such devices. However, using ordinary techniques as they have developed heretofore in the semiconductor art, it has turned out that extreme difficulties are encountered in reconciling the small junction area requirement with the requirement that the final structure be mechanically strong. Present widely-used alloy methods of making tunnel diodes require an etching step for surface clean up and junction area or peak current control which results in a very narrow, mechanically unstable, pedestal of semiconductor material supported between the alloy dot and the crystal wafer.

Also, a further difficulty presents itself in that surface leakage effects are not negligible where tolerances on the order of a few percent are imposed as, for example, in the fabrication of tunnel diodes which are to be used in computer circuits.

As a means of providing mechanically strong tunnel diode units, epitaxially grown hetero-crystal structures have been created, that is, integral crystalline structures have been formed involving the union of several semiconductor materials which differ substantially in electrical properties. In a particular application of this principle, one of the materials acts as an insulating support for the active device. The several materials are selected to have crystalline compatibility. In particular, a Ge-GaAs epitaxially grown structure has been proposed before wherein the gallium arsenide has been used as the support material and the active device has been intgrally formed with the supporting matrix.

The present invention extends the basic concept of hetero-crystalline formation to include the final packaging of devices or arrays of devices, especially those that incorporate tunnel diode junctions. Although specific reference will be made hereafter to tunnel diode junctions, the concept of the present invention is also applicable to other junctions in diodes and transistors and is applicable as well to any semiconductor device which requires extremely small area junctions and, concomitantly therewith, surface passivation. The concept is likewise applicable to a situation requiring close adjacent placement of devices such as in integrated circuits where high speed or close packing of circuits is desired.

It is at primary object of the present invention to provide a semiconductive device having mechanical strength while at the same time having a junction of very small effective area in its construction.

Another object is to provide a device having excellent surface protection and particularly to provide isolation of the junction from the surface of semiconductor crystal.

A further object is to provide a device, such as a tunnel diode, having a very small series inductance and resistance.

Yet another object is to provide arrays of tunnel diodes, or other semiconductor devices, having the aforesaid properties and characteristics.

Another object is to provide a diode package which is of such a small size that it can be used directly in a printed circuit board, or other integrated circuit, diode header.

Still another object is to provide a technique of fabrication suitable for the formation of complete circuits involving dissimilar devices.

The foregoing and other objects, features and advantages of the invention will be apparent from the following more particular description of preferred embodiments of the invention, as illustrated in the accompanying drawings.

Figure 1:
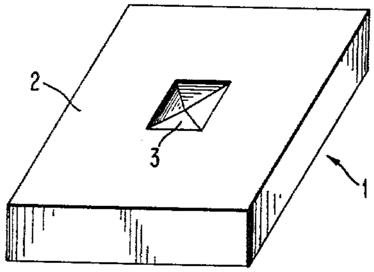
FIG. 1 is a perspective view of a semiconductor wafer to be processed in accordance with the technique of the present invention.

Referring now to the figures wherein the same numerals denote the same basic parts, in FIG. 1 a wafer of gallium arsenide material, typically having a thickness of 10–15 mils, is shown as generally indicated by the numeral 1. The material of the wafer is selected preferably to have a very high resistivity on the order of $10^8$ ohm-cm. Such an advantageously high resistivity has only relatively recently been attainable in practical quantities in such material. Properties of such material have been described in The Journal of Applied Physics, supplement to vol. 32, No. 10, October 1961, pp. 2069–2073 (C. H. Gooch et al.).

On a surface 2 of the wafer 1, as shown in FIG. 1, a conical or pyramidal pit 3 is formed by mechanical abrading, etching or ultrasonic-cavitation sandblasting. The pit may either penetrate to a depth somewhat less than the total depth of the wafer 1, or the pit may be allowed to penetrate entirely through the wafer.

Figure 1A:
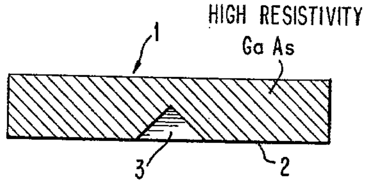
FIGS. 1A through 1E are various views of the semiconductor structures at different stages in the fabrication according to one embodiment of the present invention.
Figure 1B:
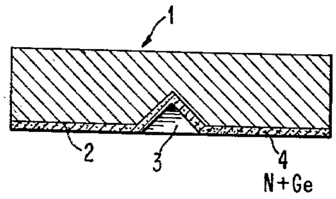

FIG. 1A depicts a side view in section of the same structure as in FIG. 1 but in an inverted position. The next step in accordance with a preferred embodiment of the present invention is the deposition of heavily doped germanium 4 on the surface 2 and into the depression 3 in the high resistivity gallium arsenide matrix. This germanium, doped to a level of approximately $10^{19}$ atoms/cc., is indicated to be of $N^+$ conductivity in FIG. 1B. The $N^+$ material is disposed, for example, by a technique generally known as vapor growth whereby the material labelled 4 is decomposed from a halide vapor that is formed by reacting a source of germanium with a halogen transport element. For details of this halide deposition technique, reference may be made to the IBM Journal of Research and Development, July 1960, pages 248 et seq. This particular technique affords the advantage of growing crystal layers at temperatures low enough so that diffusion of the important doping agents is relatively small and, hence, allows the formation of the very abrupt P-N junctions necessary for tunnel diodes. The width of the junction in these cases is approximately 100 angstroms.

Figure 1C:
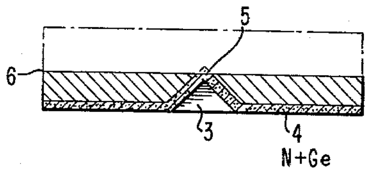
Figure 1D:
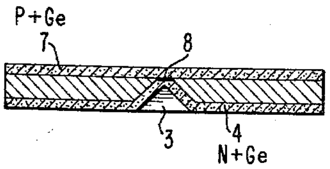

The top of the gallium arsenide wafer, as shown in FIG. 1C, is now lapped or etched until the tip 5 of the deposited germanium in the pit 3 is exposed. Where, as has been described, germanium is deposited on and into a gallium arsenide matrix, exposure of the tips will be very easily noted due to the different reflectivities of the germanium and gallium arsenide. The lapping or etching is performed to a depth represented by line 6 shown in FIG. 1C. Thereafter, heavily doped germanium, i.e., doped at approximately $10^{19}$ atoms/cc., in this example P+ type germanium labelled 7, is either vapor grown in accordance with the referenced technique, or by a technique known as solution growth, which can be another low-temperature process, onto the lapped or etched side of the wafer. Thus, a P+-N+ germanium junction, labelled 8, in FIG. 1D is defined by the respective deposition of N+ and P+ germanium, as described. It will be noted by reference back to FIG. 1 that the junction 8 which has been formed is completely encased in the high resistivity gallium arsenide matrix so that no part of the junction between the highly doped regions 4 and 7 appears as an external surface.

Figure 1E:
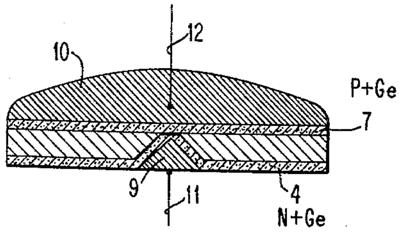

Although, for simplicity of illustration, a wafer processed into a single unit has been used as an example, it will be apparent that whole arrays, for example for memory planes in computers, of tunnel diodes and other more sophisticated semiconductor devices can be made at one time. In the situation where a large array of devices is fabricated simultaneously but individual diodes are desired, the large array will be cut up into small cylinders as shown in FIG. 1E. Also, by the use of masking and preferential etching techniques, as will be apparent to those skilled in the art, whole circuits can be made, composed of dissimilar devices.

An important consideration for many circuits, especially computer circuits, is that the characteristics of the devices be controlled to extremely close tolerances. For example, tunnel diode computer circuits often require that peak currents be held within a few percent of a design median value. In the tunnel diode case, peak currents are determined by the area of the junction and the doping levels of the N and P regions. Area control is a serious problem and it may be solved in the present case by a slightly altered technique, whereby the originally-formed pits are made to a depth less than the depth of the insulating wafer, and then, by using a well-controlled alternate technology, penetration is completed through the wafer.

Figure 2A:
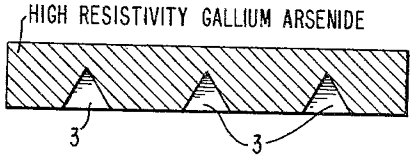
FIGS. 2A through 2C are views of a diode array at various stages of completion.
Figure 2B:
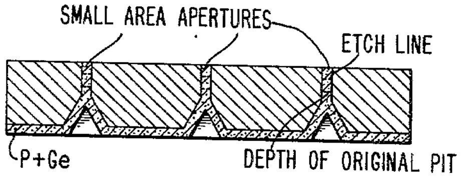
Figure 2C:
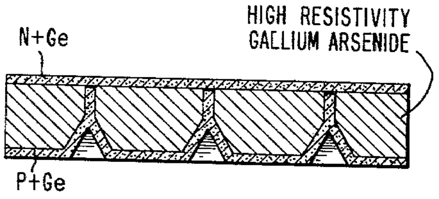

Referring now to FIGS. 2A, 2B and 2C, this alternate use of a finely-controlled technique as a means for achieving a uniformly small area is illustrated. In FIG. 2A a side view of a typical group of device-defining pits in a structural array is shown. The matrix is again of high resistivity gallium arsenide and, as described in connection with the embodiment of FIGS. 1 through 1E, pits or depressions 3 are formed through one surface of this high resistivity gallium arsenide matrix. However, in the example of FIG. 2A, the pits are first formed to a depth as indicated in that figure. Thereafter, small area cylindrical apertures are formed, as shown in FIG. 2B, through the opposite surface of the high resistivity matrix. These small area apertures, of approximately 1 mil or less, may be formed by standard photoresist and etching-masking techniques well known to those skilled in the art, by electron beam bombardment or by the use of laser beams. Alternatively, any other standard method, including sandblasting, sparking, etc., may be used. By forming the uniformly defined, small area apertures as an alternative to the procedure described in FIGS. 1 through 1E, a further advantage is gained in that more leeway is allowed in any subsequent lapping step since the lapping does not have to be perfectly parallel to the bottom surface of the matrix. After formation of the small area apertures, P+ germanium is first deposited into the matrix, followed by deposition of N+ germanium as shown in FIGS. 2B and 2C.

In fashioning particular configurations, advantage can also be taken of the fact that different semiconductor materials etch at vastly different rates with a given etchant and that different conductivities and conductivity-types of a given semiconductor also etch at different rates. For example, if electrolytic etching is employed with dilute KOH, highly doped regions etch much faster than lightly doped regions. Thus, in the example illustrated, after the P+ type germanium has been deposited into and around the gallium arsenide matrix, and the excess germanium is removed so as to give the structure illustrated in FIG. 2B, the P+ germanium at the tip of the pit, that is, at the top surface of the structure of FIG. 2B, may be etched so as to permit the formation of the junction deeper inside the matrix, as shown by the dotted lines in FIG. 2B, in order to slightly adjust the series resistance, or, if desired, the etching may be allowed to proceed far enough into the pyramid to adjust the area of the junction. With the use of KOH electrolytic etching, the magnitude of the current is, of course, related to the area being etched and, hence, calibration of the area is possible. Also, if rather than the specific example illustrated in FIG. 2B wherein P+ type germanium is initially deposited, one were to substitute the deposition of gallium arsenide, the difficulty of observing the difference between the deposited gallium arsenide material and the gallium arsenide matrix material can be obviated by the use of an electrolytic etching technique so as to reveal clearly the tips of the deposited gallium arsenide material in contrast to the matrix material.

Referring back to FIG. 1E, the single unit, which has been individually fabricated or has been cut from an array of devices fabricated en masse, is further processed by a standard procedure whereby the top and bottom surfaces of the devices are metalized, that is, the surfaces are covered with a suitable material to form ohmic contacts 9 and 10. Leads 11 and 12 are attached in a conventional way to the ohmic contacts 9 and 10 respectively. The device shown in FIG. 1E is in final form to be directly employed in circuits. Since only thin layers of deposited material are used, the rest of the contacts being metal, very low series resistance is obtained. The geometry illustrated also allows for devices having extremely low inductance. The choice of the insulating material affects the capacitance by reason of the dielectric constant. One may replace the gallium arsenide used in the several examples with zinc selenide, for instance, wihch has essentially the same lattice constant but has a lower dielectric constant, in cases where this is desirable. The choice of insulating material also affects the parallel or leakage resistance which may be due to a variety of mechanisms, such as P-I-N breakdown, or bulk or surface leakage, all of which are dependent in magnitude on the detailed properties of the chosen insulator.

An alternate method of achieving the degenerate material that is required to produce a P-N tunneling junction is to first deposit a fairly highly doped amount of germanium, for example N-type, in the indentations, as shown in FIG. 2B. This procedure also corresponds to the previously-described procedure illustrated in FIG. 1B. The wafer is lapped until the coned pits show through, but the samples are then placed, for example, in an arsenic atmosphere and the arsenic is permitted to diffuse into the exposed tip until the germanium becomes highly N-type. Again, as heretofore described, the top layer of P+ germanium is then vapor grown or, alternately, solution grown.

Although reference has been made to the deposition of germanium on and in a gallium arsenide matrix, it will be obvious that just gallium arsenide may be used for the entire structure. Also, as previously indicated, gallium arsenide may be deposited into the pits formed in the high resistivity matrix and a heterojunction may be formed, defined by the exposed tip of the initially-deposited gallium arsenide and a quantity of germanium which is deposited onto the top surface of the structure. Thus, the active P-N junction device itself may be formed partly or wholly of gallium arsenide. It will also be apparent that other combinations of semiconductors, which are compatible in the epitaxial sense, may be used. In addition, by adding layers and appropriately changing the resistivity of the deposited layers, and by adding electrodes, transistors or more complicated structures can be built.

Figure 3:
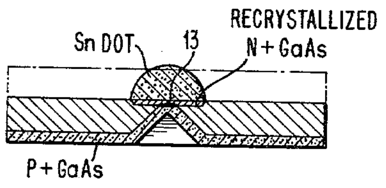
FIG. 3 illustrates another embodiment of the present invention employing an alloy dot contact.

In FIG. 3 another modification of a single-unit structure, processed in a manner similar in most respects to that illustrated in FIGS. 1 through 1E, is shown. Instead of depositing germanium into the previously-formed pit, a quantity of gallium arsenide of P+ conductivity-type is deposited into the pit. Thereafter, following the step of lapping down the wafer until the tip of the pit is exposed, a tin-doped alloy dot is situated over the exposed tip. The entire assembly is heated following a procedure well known to those skilled in the art. Due to the fact that the dot is comprised of tin which is an N-type dopant in gallium arsenide and because a very high concentration of the tin is employed, upon heating and subsequent recrystallization, an alloyed region 13 is formed in contact with the previously-formed P+ region, thereby defining a P+-N+ tunneling junction of gallium arsenide.

Figure 4A:
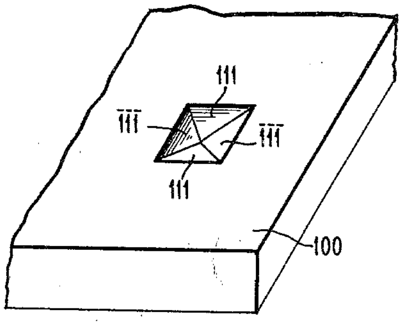
FIGS. 4A and 4B show portions of a semiconductor configuration in accordance with a further embodiment of the present invention.

Since gallium arsenide, of which the exemplary matrix in the several embodiments is composed, is a polar crystal, advantage can also be taken of preferential etching in the fashioning of the pits. For instance, if the sides of a four-sided pyramid were made to be 111 and $\overline{111}$ faces, as shown in FIG. 4A, etches exit (5 parts NaOH, 1 part $H_2O_2$) which will preferentially follow these planes resulting in a very sharply pointed edge at the bottom of the pits.

Figure 4B:
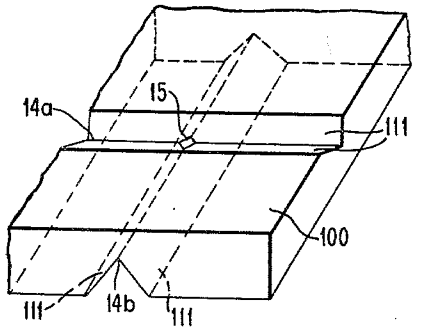

A further modification can thus be obtained as illustrated in FIG. 4B wherein grooves with triangular cross-sections are cut and then preferentially etched to form sharp-bottomed troughs **14*a* and 14*b* which when deposited with germanium and filled with metal will form diodes at their intersections 15** with the metal-lined grooves acting as wires to interconnect the separate diodes. Alternately, the groove can be completely filled with deposited degenerate germanium which can act as a wire itself, although a larger cross-section will be needed than in the metal lined case to give the same electrical loss. This modification lends itself to interconnecting arrays of devices.

It should be noted that, in order to trim peak current values to preassigned values, the junction areas may be made such that the peak currents for all of them exceed the specification and then a heat treatment may be given the diodes so as to cause atomic rearrangement at the diode interface thereby to degrade the tunneling peak by widening the junction until the specification is met. That is, it has been found possible, experimentally, to alter the tunneling current by heat treating the entire device to several hundred degrees centigrade for a few minutes.

Figure 5:
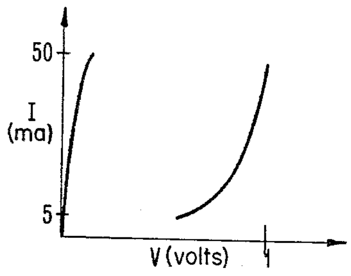
FIG. 5 illustrates a *v-i* characteristic for a typical tunnel diode constructed in accordance with the present invention.

In FIG. 5 there is depicted a typical *v–i* characteristic that has been obtained for an embedded tunneling junction fabricated in accordance with the technique of the present invention. It will be noted that a peak current of approximately 50 milliamperes is obtained and a valley current of approximately 5 milliamperes. With this typical unit, a capacitance value of approximately 47 μμf. was obtained. Thus, an $I_p/C$ ratio of approximately 1 is realized which is considered to be an excellent figure of merit. This figure of merit corresponds to a switching speed, for the particular unit, of approximately 1 nanosecond or less. With other typical units, similarly fabricated, extremely low ratios of approximately 0.3 have been obtained.

What has been disclosed is a novel technique of fabricating and encapsulating semiconductor devices, particularly tunnel diodes. This technique is partly based on the desirability of growing junctions and complex arrays of junctions using dissimilar semiconductors. The particular choice of materials in accordance with one embodiment of the present invention is based on the fact that these materials are highly versatile so that virtually all presently known useful semiconductor devices can be fabricated from them. The lattice constants and coefficients of thermal expansion of these materials are closely matched. Further, with the use of gallium arsenide as a matrix, a highly insulating support is furnished for devices that would otherwise be mechanically weak in construction. Other semiconducting and insulating materials which are epitaxially compatible are also useable.

The present invention enables the attainment of a very abrupt P-N junction (approximately 100 angstroms wide) which is a requisite for obtaining the negative resistance feature characteristic of the tunnel diode. Although the conventional alloy process has been used to produce abrupt junctions in tunnel diodes, the difficulties which attend this process have prevented the development of techniques for achieving rugged and reliable units.

While the invention has been particularly shown and described with reference to preferred embodiments thereof, it will be understod by those skilled in the art that the foregoing and other changes in form and details may be made therein without departing from the spirit and scope of the invention.

What is claimed is:

1. A process of fabricating a semiconductor device comprising the steps of:
providing a wafer of a semiconductor material of substantially intrinsic conductivity;
forming a device-defining pit, shaped such that there is convergence at its extremity, through one surface of said wafer so as to penetrate to a depth slightly less than the total depth of said wafer;
removing material from the opposite surface of said wafer to a sufficient depth so as to expose the tip of the pit formed in said wafer;
epitaxially depositing a layer of semiconductor material into said pit; and
epitaxially depositing another layer of semiconductor material on the opposite surface of said wafer so as to join the first-deposited material at the previously-defined tip, thereby to create a junction of extremely small area where the respective layers of material meet.

2. A process of fabricating a semiconductor device comprising the steps of:
providing a wafer of a semiconductor material which is substantially insulating;
forming a pit, shaped such that there is convergence at its extremity, through one surface of said wafer so as to penetrate to a depth less than the total depth of said wafer;
first epitaxially depositing a layer of semiconductor material on said one surface and into the previously-formed pit;
removing material from the opposite surface of said wafer to a sufficient depth so as to expose the first-deposited layer of semiconductor material in said pit; and
thereafter epitaxially depositing another layer of semiconductor material on the opposite surface of said wafer whereby the respective layers are joined at the previously-defined tip, thereby to create a junction of extremely small area of approximately 1 mil.

3. A process as defined in claim 2 wherein said first-deposited semiconductor material is gallium arsenide and said second-deposited material is germanium.

4. A process of fabricating a semiconductor device comprising the steps of:

providing a wafer of a first semiconductor material which is substantially insulating;

forming a pit, shaped such that there is convergence at its extremity, through one surface of said wafer so as to penetrate to a depth less than the total depth of said wafer;

epitaxially depositing a layer of semiconductor material on said one surface and into the previously-formed pit;

removing material from the opposite surface of said wafer to a sufficient depth so as to expose the layer of deposited semiconductor material in said pit; and epitaxially depositing another layer of semiconductor material from the opposite surface so as to join the first-deposited material in the pit formed in said wafer.

5. A process as defined in claim 4 wherein said first semiconductor material of said wafer is gallium arsenide and said epitaxially compatible semiconductor material is germanium.

6. A process of fabricating a semiconductor device comprising the steps of:

providing a wafer of a first semiconductor material which is substantially insulating;

initially forming a pit, shaped such that there is convergence at its extremity, through one surface of said wafer which penetrates to a depth slightly less than the total depth of said wafer;

removing material from the opposite surface of said wafer to form a finely-controlled small area aperture through said opposite surface of said wafer so as to meet the previously-formed pits and constitute an extension thereof;

epitaxially deposing a layer of semiconductor material of a first conductivity-type into the pit, as extended; and epitaxially depositing a layer of semiconductor material of opposite conductivity-type so as to join the first-deposited material in the pit formed in said wafer.

7. A process of fabricating an array of semiconductor devices comprising the steps of:

providing a wafer of a first semiconductor material, which material is substantially insulating;

forming at least two closely-spaced pits, shaped such that there is convergence at their extremities, through one surface of said wafer, which pits penetrate to a depth slightly less than the total depth of said wafer;

removing material from the opposite surface of said wafer to a sufficient depth so as to expose the tips of the respective pits formed in said wafer;

epitaxially depositing a layer of semiconductor material into the previously-formed pits; and epitaxially depositing another layer of semiconductor material on the opposite surface of said wafer so as to join the first-deposited material at the previously defined pits, thereby to create a plurality of junctions where the respective materials meet.

8. A process of fabricating a tunnel diode device comprising the steps of:

providing a wafer of a semiconductor material of substantially intrinsic conductivity;

forming a device-defining pit, shaped such that there is convergence at its extremity, through one surface of said wafer so as to penetrate to a depth slightly less than the total depth of said wafer;

removing material from the opposite surface of said wafer to a sufficient depth so as to expose the tip of the pit formed in said wafer;

epitaxially depositing degenerately doped semiconductor material of a first conductivity-type into said pit; and epitaxially depositing degenerately doped semiconductor material of opposite conductivity-type on the opposite surface of said wafer so as to join the first-deposited material at the previously-defined tip, thereby to create a tunneling junction where the respective degenerately doped materials meet.

9. A process of fabricating a tunnel diode device comprising the steps of:

providing a wafer of a first semiconductor material which is substantially insulating;

forming a pit, shaped such that there is convergence at its extremity, through one surface of said wafer to penetrate to a depth less than the total depth of said wafer;

epitaxially depositing degenerately doped semiconductor material of a first conductivity-type on said one surface and into the previously-formed pit;

removing material from the opposite surface of said wafer to a sufficient depth so as to expose the previously-deposited semiconductor material in said pit; and epitaxially depositing degenerately doped semiconductor material of opposite conductivity-type on the opposite surface of said wafer whereby the respective materials are joined at the previously-defined tip, thereby to create a tunneling junction at the place of joinder.

10. A process of fabricating a tunnel diode device comprising the steps of:

providing a wafer of a first semiconductor material which is substantially insulating;

initially forming a pit, shaped such that there is convergence at its extremity, through one surface of said wafer which penetrates to a depth slightly less than the total depth of said wafer;

removing material from the opposite surface of said wafer to form a small area aperture through said opposite surface of said wafer so as to meet the previously-formed pit and constitute an extension of the initially-formed pit;

epitaxially depositing degenerately doped semiconductor material of a first conductivity-type into the pit, as extended; and epitaxially depositing degenerately doped semiconductor material of opposite conductivity-type so as to join the first-deposited material in the pit formed in said wafer.

11. A process of fabricating an array of tunnel diode devices comprising the steps of:

providing a wafer of a first semiconductor material, which material is substantially insulating;

forming at least two closely-spaced pits, shaped such that there is convergence at their extremities, through one surface of said wafer, which pits penetrate to a depth slightly less than the total depth of said wafer;

removing material from the opposite surface of said wafer to a sufficient depth so as to expose the tips of the respective pits formed in said wafer;

epitaxially depositing degenerately doped semiconductor material of a first conductivity-type into the previously-formed pits; and epitaxially depositing semiconductor material of opposite conductivity-type on the opposite surface of said wafer so as to join the first-deposited material at the previously-defined pits, thereby to create a plurality of tunneling junctions at the places where the respective materials meet.

12. A process of fabricating a semiconductor device prising the steps of:

providing a wafer of semiconductor material of substantially intrinsic conductivity, having a resistivity of approximately $10^8$ ohm-cm., forming a device-defining pit, shaped such that there is convergence at its extremity, through one surface of said wafer to penetrate to a depth slightly less than the total depth of said wafer, epitaxially depositing semiconductor material on said original wafer into said pit, and removing material from the opposite surface thereof to a depth sufficient to reach the tip of the pit previously formed, and defining solely with said material deposited in said pit a p-n junction which is of extremely small area, as limited by the area of said tip.

13. A process as defined in claim 12 wherein said wafer is constituted by gallium arsenide and said deposited material is germanium.

References Cited by the Examiner

UNITED STATES PATENTS

| | | | |
|---|---|---|---|
| 3,000,768 | 9/61 | Marinace | 148—33 X |
| 3,008,089 | 11/61 | Uhlir | 143—1.5 X |

DAVID L. RECK, *Primary Examiner.*